United States Patent
Li et al.

(10) Patent No.: US 9,331,172 B2
(45) Date of Patent: May 3, 2016

(54) METHOD FOR MAKING HKMG DUMMY GATE STRUCTURE WITH AMORPHOUS/ONO MASKING STRUCTURE AND PROCEDURE

(71) Applicant: INSTITUTE OF MICROELECTRONICS, CHINESE ACADEMY OF SCIENCES, Beijing (CN)

(72) Inventors: Chunlong Li, Beijing (CN); Junfeng Li, Beijing (CN); Jiang Yan, Newburgh, NY (US); Lingkuan Meng, Beijing (CN); Xiaobin He, Beijing (CN); Guanglu Chen, Beijing (CN); Chao Zhao, Kessel-lo (BE)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/426,690

(22) PCT Filed: Nov. 13, 2012

(86) PCT No.: PCT/CN2012/001537
§ 371 (c)(1),
(2) Date: Mar. 6, 2015

(87) PCT Pub. No.: WO2014/040213
PCT Pub. Date: Mar. 20, 2014

(65) Prior Publication Data
US 2015/0214332 A1    Jul. 30, 2015

(30) Foreign Application Priority Data
Sep. 12, 2012  (CN) .......................... 2012 1 0336478

(51) Int. Cl.
*H01L 29/66* (2006.01)
*H01L 21/3105* (2006.01)
*H01L 29/51* (2006.01)

(52) U.S. Cl.
CPC .... *H01L 29/66545* (2013.01); *H01L 21/31055* (2013.01); *H01L 29/51* (2013.01); *H01L 29/66492* (2013.01); *H01L 29/66621* (2013.01); *H01L 29/66833* (2013.01)

(58) Field of Classification Search
CPC ................... H01L 29/66545; H01L 21/28123
See application file for complete search history.

(56) References Cited

U.S. PATENT DOCUMENTS 5,342,801 A * 8/1994 Perry ................ H01L 21/28273
257/E21.209
6,037,265 A * 3/2000 Mui ........................ C09K 13/00
252/79.1

(Continued)

FOREIGN PATENT DOCUMENTS

| CN | 101673676 A | 3/2010 |
|----|-------------|--------|
| CN | 102386085 A | 3/2012 |
| JP | 2006-332130 A | 12/2006 |

*Primary Examiner* — Matthew Landau
*Assistant Examiner* — Grant Withers
(74) *Attorney, Agent, or Firm* — Christensen Fonder P.A.

(57) ABSTRACT

A method for manufacturing a dummy gate structure. The method may include: forming a dummy gate oxide layer and a dummy gate material layer on a semiconductor substrate sequentially; forming an ONO structure on the dummy gate material layer; forming a top amorphous silicon layer on the ONO structure; forming a patterned photoresist layer on the top amorphous silicon layer; etching the top amorphous silicon layer with the patterned photoresist layer as a mask, the etching being stopped on the ONO structure; etching the ONO structure with the patterned photoresist layer and a remaining portion of the top amorphous silicon layer as a mask, the etching being stopped on the dummy gate material layer; removing the patterned photoresist layer; and etching the dummy gate material layer, the etching being stopped at the dummy gate oxide layer to form a dummy gate structure.

20 Claims, 3 Drawing Sheets

(56) References Cited

U.S. PATENT DOCUMENTS

| | | | | |
|---|---|---|---|---|
| 6,297,092 B1* | 10/2001 | Rudeck | H01L 21/28273 | 257/E21.209 |
| 6,897,514 B2* | 5/2005 | Kouznetsov | H01L 27/0688 | 257/296 |
| 7,776,757 B2* | 8/2010 | Lin | H01L 21/28088 | 257/E21.224 |
| 7,919,370 B2* | 4/2011 | Lim | H01L 27/115 | 257/314 |
| 8,329,515 B2* | 12/2012 | Yang | H01L 21/823807 | 257/350 |
| 8,334,198 B2* | 12/2012 | Chen | H01L 21/823437 | 257/E21.444 |
| 8,410,555 B2* | 4/2013 | Wang | H01L 21/823857 | 257/350 |
| 8,786,030 B2* | 7/2014 | Ando | H01L 21/28079 | 257/410 |
| 9,111,863 B2* | 8/2015 | Li | H01L 21/28123 | |
| 9,136,181 B2* | 9/2015 | Xu | H01L 29/78 | |
| 2002/0142546 A1* | 10/2002 | Kouznetsov | H01L 27/0688 | 438/257 |
| 2003/0034517 A1* | 2/2003 | Chen | H01L 21/28273 | 257/315 |
| 2004/0023500 A1* | 2/2004 | Dokumaci | H01L 29/66545 | 438/694 |
| 2004/0150032 A1* | 8/2004 | Wu | H01L 21/28273 | 257/315 |
| 2005/0118531 A1* | 6/2005 | Lee | H01L 21/0274 | 430/311 |
| 2006/0183308 A1* | 8/2006 | Zhang | H01L 21/28123 | 438/570 |
| 2007/0215929 A1* | 9/2007 | Yasuda | H01L 21/28273 | 257/347 |
| 2008/0085590 A1* | 4/2008 | Yao | H01L 21/28097 | 438/583 |
| 2008/0157177 A1* | 7/2008 | Lim | H01L 27/115 | 257/321 |
| 2009/0130836 A1* | 5/2009 | Sun | H01L 29/7881 | 438/594 |
| 2011/0309455 A1* | 12/2011 | Ando | H01L 21/28079 | 257/410 |
| 2012/0264281 A1* | 10/2012 | Chen | H01L 21/823437 | 438/591 |
| 2014/0225176 A1* | 8/2014 | Cheek | H01L 27/11546 | 257/314 |
| 2014/0227843 A1* | 8/2014 | Tsukamoto | H01L 29/6659 | 438/275 |
| 2014/0273426 A1* | 9/2014 | Li | H01L 21/28123 | 438/591 |
| 2014/0332958 A1* | 11/2014 | Li | H01L 29/66545 | 257/741 |
| 2014/0361353 A1* | 12/2014 | Yin | H01L 21/28114 | 257/288 |
| 2015/0035087 A1* | 2/2015 | Li | H01L 21/28123 | 257/411 |
| 2015/0214332 A1* | 7/2015 | Li | H01L 29/51 | 437/287 |
| 2015/0262887 A1* | 9/2015 | Xu | H01L 21/823842 | 438/216 |

* cited by examiner

METHOD FOR MAKING HKMG DUMMY GATE STRUCTURE WITH AMORPHOUS/ONO MASKING STRUCTURE AND PROCEDURE

CROSS-REFERENCE TO RELATED APPLICATION(S)

This application is a national stage application of PCT Application No. PCT/CN2012/001537, filed on Nov. 13, 2012, entitled "METHOD FOR MANUFACTURING SEMICONDUCTOR DEVICE, which claimed priority to Chinese Application No. 201210336478.2, filed on Sep. 12, 2012. Both the PCT Application and the Chinese Application are incorporated herein by reference in their entireties.

TECHNICAL FIELD

The present disclosure relates to manufacture of semiconductor devices, and in particular, to a method for manufacturing a dummy gate in a gate last process.

BACKGROUND

With continuous scaling down of transistors, HKMG (High K dielectric layer and Metal Gate) technology has become essential for manufacture processes of 45 nm and beyond. In the HKMG technology, the Gate Last approach is widely favored by numerous leading semiconductor companies. Among them, some companies (for example, Intel from the U.S.) have already produced HKMG-based products according to the gate-last process. The so-called gate-last process means that in a process of manufacturing a transistor, a dummy gate is firstly formed, and then processes, such as forming a spacer by deposition and etching and forming source/drain regions by source/drain implantations, are performed to form components of the transistor other than a gate, and finally the dummy gate is replaced with the gate for the transistor. Generally, the dummy gate comprises an amorphous silicon or polysilicon dummy gate formed on a silicon dioxide layer, and the finally-formed transistor gate comprises a metal gate in the HKMG technology.

So far the gate last process presents some unique advantages. For example, negative impacts resulted from a high temperature process can be mitigated. In particular, restrictions on selection of the metal gate material due to high temperature can be removed. Further, the gate-last process facilitates improving significant stress in the transistor channel, which is particularly useful for improving performances of PFETs. However, there are still some difficulties in the existing gate-last process, for example, formation of ultra-fine lines (45 nm or below), precise control of critical dimensions and profile of a gate, and control of profile and remaining thickness of a hard mask structure, or the like. Therefore, there is a need for a new gate last process, in particular, a process for forming a dummy gate, to address the above difficulties, thereby mitigating problems in manufacturing a transistor and guaranteeing performances of the transistor.

SUMMARY

The present disclosure provides a method for manufacturing a dummy gate in a gate last process for transistors, to avoid some defects in the existing gate last process.

According to an aspect of the present disclosure, there is provided a method for manufacturing a semiconductor device, comprising: forming a dummy gate oxide layer and a dummy gate material layer on a semiconductor substrate sequentially; forming an ONO structure on the dummy gate material layer, wherein the ONO structure comprises a first oxide layer, a nitride layer, and a second oxide layer from bottom up; forming a top amorphous silicon layer on the ONO structure; forming a patterned photoresist layer on the top amorphous silicon layer; etching the top amorphous silicon layer with the patterned photoresist layer as a mask, the etching being stopped on the uppermost layer of the ONO structure; etching the ONO structure with the patterned photoresist layer and a remaining portion of the top amorphous silicon layer as a mask, the etching being stopped on a top surface of the dummy gate material layer; removing the patterned photoresist layer; and etching the dummy gate material layer, the etching being stopped on a top surface of the dummy gate oxide layer to form a dummy gate structure.

According to an aspect of the present disclosure, the dummy gate material layer comprises amorphous silicon with a thickness of 900-1200 Å, and the dummy gate oxide layer comprises silicon dioxide with a thickness of about 20-40 Å.

According to an aspect of the present disclosure, the first oxide layer comprises $SiO_2$ with a thickness of 100 Å, the nitride layer comprises $Si_3N_4$ with a thickness of 200 Å, and the second oxide layer comprises $SiO_2$ with a thickness of 500-800 Å.

According to an aspect of the present disclosure, the etching of the ONO structure is performed in three stages, in which the second oxide layer, the nitride layer, and the first oxide layer are etched, respectively.

According to an aspect of the present disclosure, the top amorphous silicon layer has a thickness of 400-600 Å.

According to an aspect of the present disclosure, the etching of the dummy gate material layer comprises: etching the dummy gate material layer with the remaining portion of the top amorphous silicon layer and the ONO structure as a mask, the etching being stopped on the top surface of the dummy gate oxide layer, wherein the remaining portion of the top amorphous silicon layer is completely removed while the etching is performed.

According to an aspect of the present disclosure, after the dummy gate structure is formed, the method further comprises: forming a gate spacer; forming LDD regions, HALO structures, and source/drain regions in a self-aligned manner; forming contacts to the source/drain regions; and forming an interlayer dielectric layer and performing a CMP process thereon.

According to an aspect of the present disclosure, after the forming of the interlayer dielectric layer and the performing of the CMP process, the method further comprises: removing the dummy gate and the dummy gate oxide layer thereunder to form a gate trench in the interlayer dielectric layer; and depositing a high-K gate dielectric material and a metal gate material in the gate trench in sequence and performing a CMP process thereon to form a high K gate dielectric layer and a metal gate.

There can be some advantages. According to embodiments of the present disclosure, the ONO structure and the top amorphous silicon layer are formed on the dummy gate material layer, and then the ONO structure is etched with the patterned top amorphous silicon layer as a mask. Thus, it is possible to precisely control dimensions and the profile of the ONO structure such that the ONO structure becomes a desired mask for the dummy gate material layer. Further, it is possible to control final thicknesses of the respective layers in the ONO structure. Then, the dummy gate material layer is etched with the ONO structure as a mask. Thus, it is possible to achieve accurate transfer of the pattern, and thus to precisely control critical dimensions and profile of the dummy gate. Thereby, the subsequently formed metal gate can have a good line-edge roughness. This facilitates the subsequent processes, such as formation of the spacer formation of silicide, CMP, or the like, to proceed smoothly. In this way, it is possible to ensure performances and stability of the resultant device. Further, the technology disclosed herein is applicable to the sub-45 nm technology. It is not only applicable to mass production in factories, but also to pilot development in laboratories. With some partial optimization, it has the capability of being upgraded to a more advanced manufacturing technology.

DETAILED DESCRIPTION

Hereinafter, the technology disclosed herein is described with reference to embodiments thereof shown in the attached drawings. However, it should be noted that those descriptions are just provided for illustrative purpose, rather than limiting the present disclosure. Further, in the following, descriptions of known structures and techniques are omitted so as not to obscure the concept of the present disclosure.

There is provided a method for manufacturing a semiconductor device, and in particular, a method for manufacturing a dummy gate in a gate-last process. The method addresses some difficulties in the existing gate-last process. In the following, the method for manufacturing a semiconductor device according to an embodiment of the present disclosure will be described in detail with reference to FIGS. 1-8.

Figure 1:
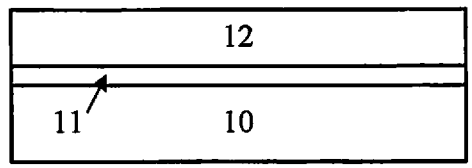
FIGS. 1-8 are schematic views showing a flow of manufacturing a semiconductor device according to an embodiment of the present disclosure.

Referring to FIG. 1, a dummy gate oxide layer 11 and a dummy gate material layer 12 are formed on a semiconductor substrate 10 in sequence. In this embodiment, a monocrystalline silicon substrate is exemplified. Alternatively, a germanium substrate or any other appropriate semiconductor substrate may be used. The dummy gate oxide layer 11 may be formed by thermal oxidation, and may comprise $SiO_2$, preferably with a thickness of 20-40 Å. The dummy gate material layer 12 comprises preferably an amorphous silicon layer, and alternatively a polysilicon layer, which is formed by LPCVD, preferably with a thickness of 900-1200 Å.

Figure 2:
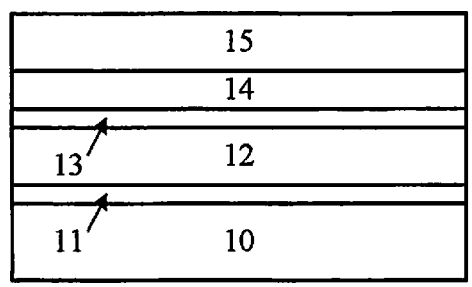

Next, referring to FIG. 2, a first oxide layer 13, a nitride layer 14, and a second oxide layer 15 are formed on the dummy gate material layer 12 in sequence. The first oxide layer 13, the nitride layer 14, and the second oxide layer 15 form an ONO structure. The first oxide layer 13 may comprise $SiO_2$, formed by PECVD, with a thickness of 100 Å. The nitride layer 14 may comprise $Si_3N_4$, formed by LPCVD, with a thickness of 200 Å. The second oxide layer 15 may comprise $SiO_2$, formed by PECVD, with a thickness of 500-800 Å.

Figure 3:
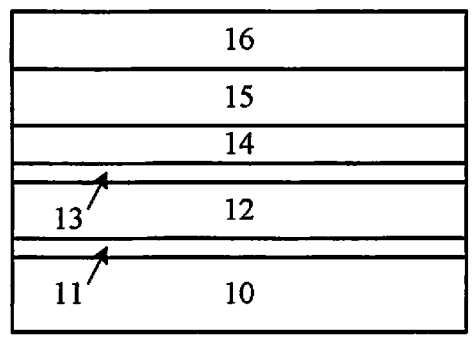

Next, referring to FIG. 3, on the ONO structure, a top amorphous silicon layer 16 is formed. The top amorphous silicon layer 16 is formed by LPCVD, and has a thickness of 400-600 Å.

Figure 4:
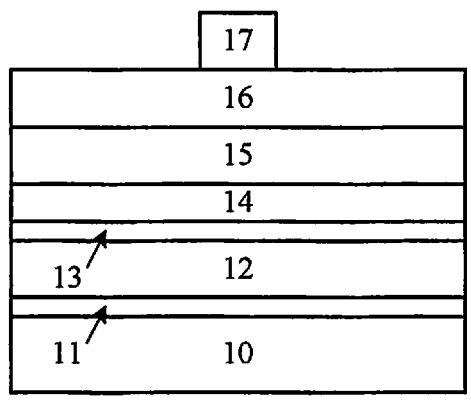

Subsequently, referring to FIG. 4, a patterned photoresist layer 17 is formed on the top amorphous silicon layer 16. This can be done as follows. A blanket layer of photoresist is coated, and then the photoresist layer is exposed by immersion photolithography or eBeam direct write photolithography to form the patterned photoresist layer 17. The patterned photoresist layer 17 has a line size less than 45 nm.

Figure 5:
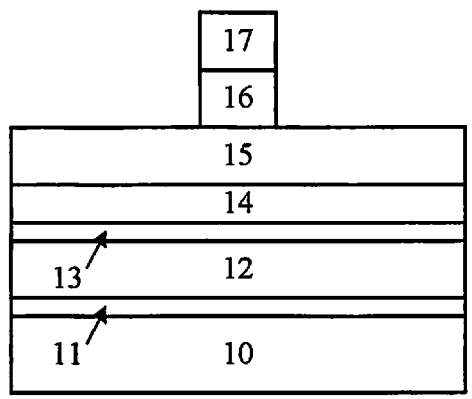

Next, referring to FIG. 5, the top amorphous silicon layer 16 is etched with the patterned photoresist layer 17 as a mask. This etching process may comprise plasma dry etching. The etching is stopped on the uppermost layer of the ONO structure, i.e., on a top surface of the second oxide layer 15.

Figure 6:
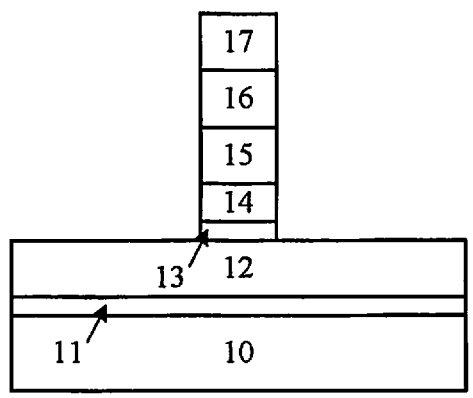

Next, referring to FIG. 6, the ONO structure is etched with the patterned photoresist layer 17 and a remaining portion of the top amorphous silicon layer 16 as a mask. This etching process may be performed in three different stages, in which the second oxide layer 15, the nitride layer 14, and the first oxide layer 13 are etched, respectively. The etching is finally stopped on a top surface of the dummy gate material layer 12.

Figure 7:
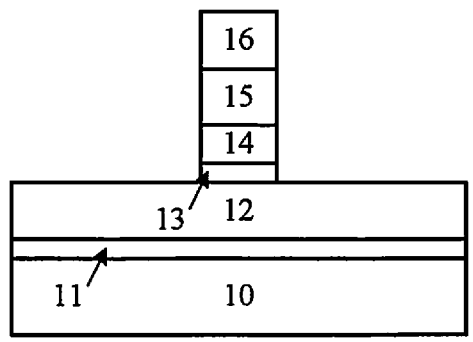

Next, referring to FIG. 7, the patterned photoresist layer 17 is removed. Specifically, the patterned photoresist layer 17 is cleaned and thus removed by wet cleaning with, for example, SPM/APM (SPM: a mixture of $H_2SO_4$, $H_2O_2$, and $H_2O$; and APM: a mixture of $NH_4OH$, $H_2O_2$, and $H_2O$).

Figure 8:
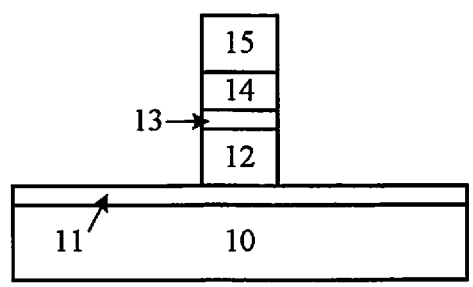

Next, referring to FIG. 8, the dummy gate material layer 12 is etched, and the etching is stopped on a top surface of the dummy gate oxide layer 11. This etching uses the remaining portion of the top amorphous silicon layer 16 and the ONO structure as a mask to etch the dummy gate material layer 12. Because the top amorphous silicon layer 16 and the dummy gate material layer 12 comprise the same material, for example, amorphous silicon, the top amorphous silicon layer 16 will be completely removed in this etching step. Therefore, this is no need for an additional step for removing the top amorphous silicon layer 16. This etching step results in a dummy, gate. Here, the dummy gate stack comprises the dummy gate material layer 12 and the ONO structure thereon.

After the dummy gate is formed, rest components of a transistor may be manufactured by, for example, forming a gate spacer by deposition and etching, forming LDD regions, HALO structures, and source/drain regions in a self-aligned manner, forming contacts to the source/drain regions, forming an interlayer dielectric layer and performing a CMP process thereon, or the like. After the above components are manufactured, the dummy gate and the dummy gate oxide layer thereunder are removed. As a result, a gate trench is formed in the interlayer dielectric layer. After that, a high-K gate dielectric material and a metal gate material are deposited in the gate trench in sequence, and a CMP process is performed thereon, resulting in a high-K gate dielectric layer and a metal gate. Then, the HKMG process is finished.

Thus, the manufacturing method presented by the present disclosure has been described in detail. According to embodiments of the present disclosure, the ONO structure and the top amorphous silicon layer are formed on the dummy gate material layer, and then the ONO structure is etched with the patterned top amorphous silicon layer as a mask. Thus, it is possible to precisely control dimensions and profile of the ONO structure such that the ONO structure becomes a desired mask for the dummy gate material layer. Further, it is possible to control etching rates and thicknesses of the respective layers in the ONO structure. Then, the dummy gate material layer is etched with the ONO structure as a mask. Thus, it is possible to achieve accurate transfer of the pattern, and thus to precisely control critical dimensions and profile of the dummy gate. Thereby, the subsequently formed metal gate can have a good line edge roughness (LER). In this way, it is possible to ensure performance and stability of the resultant device. Further, this facilitates the subsequent processes, such as formation of the spacer, the CMP process, the removal of the dummy gate, or the like, to proceed smoothly. Further, the technology disclosed herein is applicable to the sub-45 nm technology. It is not only applicable to mass production in factories, but also to pilot development in laboratories. With some partial optimization, it has the capability of being upgraded to a more advanced manufacturing technology (for example, a technology of 22 nm beyond).

The present disclosure is described above with reference to the embodiments thereof. However, those embodiments are provided just for illustrative purpose, rather than limiting the present disclosure. The scope of the disclosure is defined by the attached claims as well as equivalents thereof. Those skilled in the art can make various alternations and modifications without departing from the scope of the disclosure, which all fall within the scope of the disclosure.

We claim:

1. A method for manufacturing a semiconductor device, comprising:
    forming a dummy gate oxide layer and a dummy gate material layer on a semiconductor substrate sequentially;
    forming an ONO structure on the dummy gate material layer, wherein the ONO structure comprises a first oxide layer, a nitride layer, and a second oxide layer from the first oxide layer up to the second oxide layer;
    forming a top amorphous silicon layer on the ONO structure;
    forming a patterned photoresist layer on the top amorphous silicon layer;
    etching the top amorphous silicon layer with the patterned photoresist layer as a mask, the etching being stopped on the uppermost layer of the ONO structure;
    etching the ONO structure with the patterned photoresist layer and a remaining portion of the top amorphous silicon layer as a mask, the etching being stopped on a top surface of the dummy gate material layer;
    removing the patterned photoresist layer; and
    etching the dummy gate material layer, the etching being stopped at a top surface of the dummy gate oxide layer to form a dummy gate structure,
    wherein the dummy gate material layer comprises amorphous silicon with a thickness of 900-1200 Å, and the dummy gate oxide layer comprises silicon dioxide with a thickness of about 20-40 Å.

2. The method according to claim 1, wherein the first oxide layer comprises $SiO_2$ with a thickness of 100 Å, the nitride layer comprises $Si_3N_4$ with a thickness of 200 Å, and the second oxide layer comprises $SiO_2$ with a thickness of 500-800 Å.

3. The method according to claim 1, wherein the etching of the ONO structure is performed in three stages, in which the second oxide layer, the nitride layer, and the first oxide layer are etched, respectively.

4. The method according to claim 1, wherein the top amorphous silicon layer has a thickness of 400-600 Å.

5. The method according to claim 1, wherein the etching of the dummy gate material layer comprises:
    etching the dummy gate material layer with the remaining portion of the top amorphous silicon layer and the ONO structure as a mask, the etching being stopped on the top surface of the dummy gate oxide layer,
    wherein the remaining portion of the top amorphous silicon layer is completely removed while the etching is performed.

6. The method according to claim 1, wherein after the dummy gate structure is formed, the method further comprises:
    forming a gate spacer;
    forming LDD regions, HALO structures, and source/drain regions in a self-aligned manner;
    forming contacts to the source/drain regions; and
    forming an interlayer dielectric layer and performing a CMP process thereon.

7. The method according to claim 6, wherein after the forming of the interlayer dielectric layer and the performing of the CMP process, the method further comprises:
    removing the dummy gate and the dummy gate oxide layer thereunder to form a gate trench in the interlayer dielectric layer; and
    depositing a high K gate dielectric material and a metal gate material in the gate trench in sequence and performing a CMP process thereon to form a high-K gate dielectric layer and a metal gate.

8. A method for manufacturing a semiconductor device, comprising:
    forming a dummy gate oxide layer and a dummy gate material layer on a semiconductor substrate sequentially;
    forming an ONO structure on the dummy gate material layer, wherein the ONO structure comprises a first oxide layer, a nitride layer, and a second oxide layer from the first oxide layer up to the second oxide layer;
    forming a top amorphous silicon layer on the ONO structure;
    forming a patterned photoresist layer on the top amorphous silicon layer;
    etching the top amorphous silicon layer with the patterned photoresist layer as a mask, the etching being stopped on the uppermost layer of the ONO structure;
    etching the ONO structure with the patterned photoresist layer and a remaining portion of the top amorphous silicon layer as a mask, the etching being stopped on a top surface of the dummy gate material layer;
    removing the patterned photoresist layer; and
    etching the dummy gate material layer, the etching being stopped at a top surface of the dummy gate oxide layer to form a dummy gate structure
    wherein the etching of the dummy gate material layer comprises:
        etching the dummy gate material layer with the remaining portion of the top amorphous silicon layer and the ONO structure as a mask, the etching being stopped on the top surface of the dummy gate oxide layer, and the remaining portion of the top amorphous silicon layer is completely removed while the etching is performed.

9. The method according to claim 8, wherein the dummy gate material layer comprises amorphous silicon with a thickness of 900-1200 Å, and the dummy gate oxide layer comprises silicon dioxide with a thickness of about 20-40 Å.

10. The method according to claim 8, wherein the first oxide layer comprises $SiO_2$ with a thickness of 100 Å, the nitride layer comprises $Si_3N_4$ with a thickness of 200 Å, and the second oxide layer comprises $SiO_2$ with a thickness of 500-800 Å.

11. The method according to claim 8, wherein the etching of the ONO structure is performed in three stages, in which the second oxide layer, the nitride layer, and the first oxide layer are etched, respectively.

12. The method according to claim 8, wherein the top amorphous silicon layer has a thickness of 400-600 Å.

13. The method according to claim 8, wherein after the dummy gate structure is formed, the method further comprises:
    forming a gate spacer;
    forming LDD regions, HALO structures, and source/drain regions in a self-aligned manner;
    forming contacts to the source/drain regions; and forming an interlayer dielectric layer and performing a CMP process thereon.

14. The method according to claim 13, wherein after the forming of the interlayer dielectric layer and the performing of the CMP process, the method further comprises:
removing the dummy gate and the dummy gate oxide layer thereunder to form a gate trench in the interlayer dielectric layer; and
depositing a high K gate dielectric material and a metal gate material in the gate trench in sequence and performing a CMP process thereon to form a high-K gate dielectric layer and a metal gate.

15. A method for manufacturing a semiconductor device, comprising:
forming a dummy gate oxide layer and a dummy gate material layer on a semiconductor substrate sequentially;
forming an ONO structure on the dummy gate material layer, wherein the ONO structure comprises a first oxide layer, a nitride layer, and a second oxide layer from the first oxide layer up to the second oxide layer;
forming a top amorphous silicon layer on the ONO structure;
forming a patterned photoresist layer on the top amorphous silicon layer;
etching the top amorphous silicon layer with the patterned photoresist layer as a mask, the etching being stopped on the uppermost layer of the ONO structure;
etching the ONO structure with the patterned photoresist layer and a remaining portion of the top amorphous silicon layer as a mask, the etching being stopped on a top surface of the dummy gate material layer;
removing the patterned photoresist layer; and
etching the dummy gate material layer, the etching being stopped at a top surface of the dummy gate oxide layer to form a dummy gate structure
wherein after the dummy gate structure is formed, the method further comprises:

forming a gate spacer;
forming LDD regions, HALO structures, and source/drain regions in a self-aligned manner;
forming contacts to the source/drain regions; and
forming an interlayer dielectric layer and performing a CMP process thereon.

16. The method according to claim 15, wherein the first oxide layer comprises $SiO_2$ with a thickness of 100 Å, the nitride layer comprises $Si_3N_4$ with a thickness of 200 Å, and the second oxide layer comprises $SiO_2$ with a thickness of 500-800 Å.

17. The method according to claim 15, wherein the etching of the ONO structure is performed in three stages, in which the second oxide layer, the nitride layer, and the first oxide layer are etched, respectively.

18. The method according to claim 15, wherein the top amorphous silicon layer has a thickness of 400-600 Å.

19. The method according to claim 15, wherein the etching of the dummy gate material layer comprises:
etching the dummy gate material layer with the remaining portion of the top amorphous silicon layer and the ONO structure as a mask, the etching being stopped on the top surface of the dummy gate oxide layer,
wherein the remaining portion of the top amorphous silicon layer is completely removed while the etching is performed.

20. The method according to claim 19, wherein after the forming of the interlayer dielectric layer and the performing of the CMP process, the method further comprises:
removing the dummy gate and the dummy gate oxide layer thereunder to form a gate trench in the interlayer dielectric layer; and
depositing a high K gate dielectric material and a metal gate material in the gate trench in sequence and performing a CMP process thereon to form a high-K gate dielectric layer and a metal gate.

* * * * *